United States Patent
Kaneko

(10) Patent No.: US 8,125,004 B2
(45) Date of Patent: Feb. 28, 2012

(54) FIELD-EFFECT SEMICONDUCTOR DEVICE

(75) Inventor: Nobuo Kaneko, Saitama (JP)

(73) Assignee: Sanken Electric Co., Ltd. (JP)

( * ) Notice: Subject to any disclaimer, the term of this patent is extended or adjusted under 35 U.S.C. 154(b) by 137 days.

(21) Appl. No.: 12/644,907

(22) Filed: Dec. 22, 2009

(65) Prior Publication Data

US 2010/0155720 A1    Jun. 24, 2010

(30) Foreign Application Priority Data

Dec. 24, 2008  (JP) ................... 2008-328291

(51) Int. Cl.
    H01L 29/66    (2006.01)
(52) U.S. Cl. ............. 257/194; 257/183; 257/E21.403; 257/E21.407; 257/E29.246; 257/E29.252; 257/E29.253; 257/E29.255
(58) Field of Classification Search ........... 257/183, 257/194, E21.403, E21.407, E29.246, E29.252, 257/E29.253, E29.255
See application file for complete search history.

(56) References Cited

U.S. PATENT DOCUMENTS

| | | | | |
|---|---|---|---|---|
| 2004/0206979 | A1* | 10/2004 | Braddock | 257/192 |
| 2006/0060871 | A1* | 3/2006 | Beach | 257/94 |
| 2006/0157729 | A1* | 7/2006 | Ueno et al. | 257/103 |
| 2007/0026587 | A1* | 2/2007 | Briere | 438/159 |
| 2008/0006845 | A1* | 1/2008 | Derluyn et al. | 257/192 |
| 2010/0012977 | A1* | 1/2010 | Derluyn et al. | 257/194 |

FOREIGN PATENT DOCUMENTS

| | | |
|---|---|---|
| JP | 20060222414 A | 8/2006 |
| WO | 03071607 A1 | 8/2003 |

* cited by examiner

*Primary Examiner* — Benjamin Sandvik
*Assistant Examiner* — Farid Khan
(74) *Attorney, Agent, or Firm* — Woodcock Washburn LLP

(57) ABSTRACT

A heterojunction field-effect semiconductor device has a main semiconductor region comprising two layers of dissimilar materials such that a two-dimensional electron gas layer is generated along the heterojunction between the two layers. A source and a drain electrode are placed in spaced positions on a major surface of the main semiconductor region and electrically coupled to the 2DEG layer. Between these electrodes, a gate electrode is received in a recess in the major surface of the main semiconductor region via a p-type metal oxide semiconductor film and insulating film, whereby a depletion zone is normally created in the 2DEG layer, making the device normally off. The p-type metal oxide semiconductor film of high hole concentration serves for the normally-off performance of the device with low gate leak current, and the insulating film for further reduction of gate leak current.

21 Claims, 7 Drawing Sheets

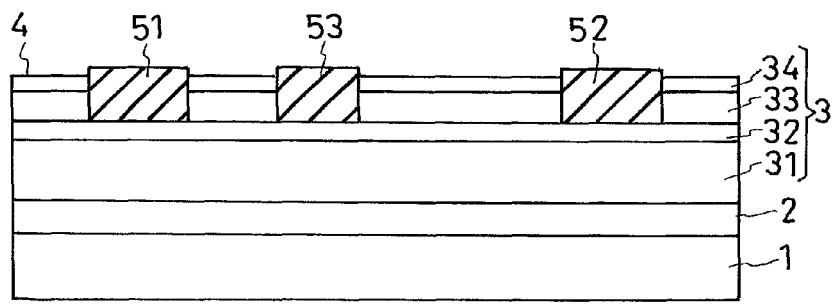
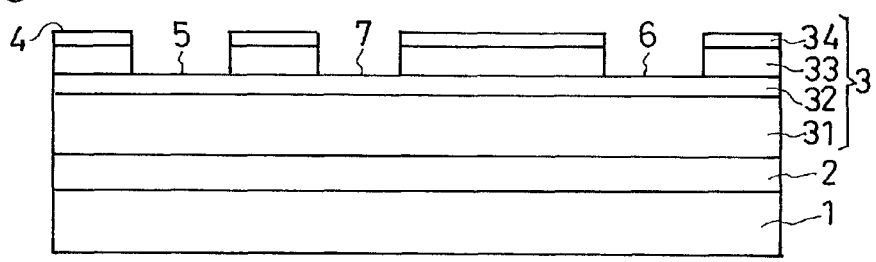
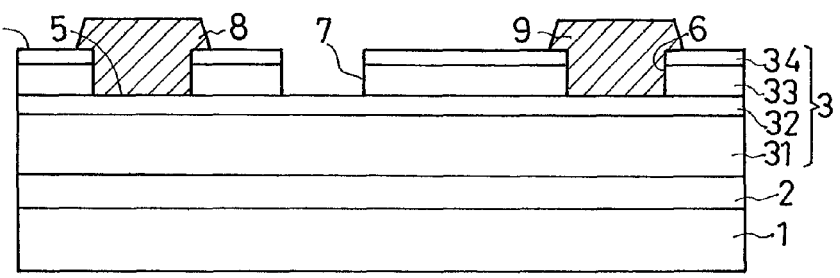
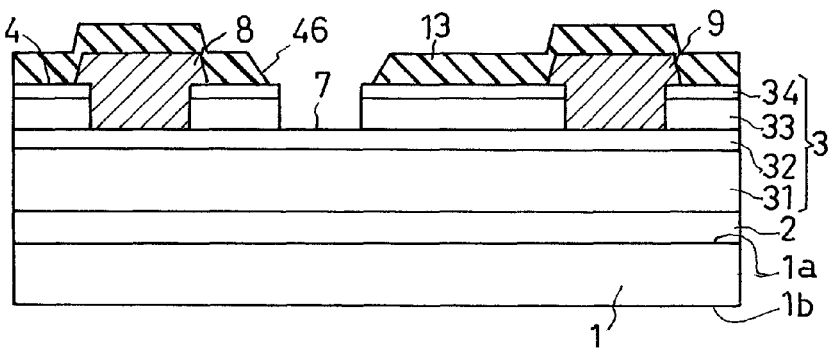

FIELD-EFFECT SEMICONDUCTOR DEVICE

CROSS REFERENCE TO RELATED APPLICATIONS

This application claims priority to Japanese Patent Application No. 2008-328291, filed Dec. 24, 2008.

BACKGROUND OF THE INVENTION

This invention relates to semiconductor devices, particularly to field-effect semiconductor devices as typified by the high electron mobility transistor (HEMT), the two-dimensional electron gas (2DEG) diode (diode that utilizes a layer of 2DEG as a current path or channel), and the metal-semiconductor field-effect transistor (MESFET). More particularly, the invention pertains to such field-effect semiconductor devices that are normally off, instead of normally on as in the case of most of such devices known heretofore. The invention also deals with a method of fabricating such normally-off field-effect semiconductor devices.

The HEMT, a type of FET, has been known and used extensively which comprises an electron transit layer overlying a substrate via a buffer, and an electron supply or barrier layer on the electron transit layer. The electron transit layer is of undoped semiconducting nitride such as gallium nitride (GaN) grown on a silicon or sapphire substrate. The electron supply layer is of either n-doped or undoped semiconductor nitride such as aluminum gallium nitride (AlGaN) deposited on the electron transit layer. A source, a drain and a gate (Schottky) electrode are all disposed on the electron supply layer.

Made from the dissimilar semiconducting materials as above, the electron transit layer and electron supply layer differ in both bandgap and lattice constant. The electron supply layer of AlGaN or the like is greater in bandgap, and less in lattice constant, than the electron transit layer of GaN or the like. By being placed on the electron transit layer having a greater lattice constant, the electron supply layer gives rise to an expansive strain or tensile stress and hence to piezoelectric depolarization. The electron supply layer is additionally subject to spontaneous depolarization.

Consequently, due to both piezoelectric and spontaneous depolarizations, what is known as 2DEG, a gas of electrons free to move in two dimensions only, appears along the heterojunction between the electron supply layer and the electron transit layer. The 2DEG provides a channel of very low resistance, or of high electron mobility, for source-drain current flow. This current flow is controllable by a bias voltage applied to the gate electrode.

As heretofore constructed, the HEMTs of the general construction above were mostly normally on; that is, there was a source-drain flow of electrons while no voltage was applied to the gate. The normally-on HEMT had to be turned off using a negative power supply for causing the gate electrode to gain a negative potential. Use of such a negative power supply made the associated circuitry unnecessary complex and expensive. The conventional normally-on HEMTs were rather inconvenient of use.

Attempts have been made to develop normally-off heterojunction FETs. Among the suggestions heretofore made toward this end are:

1. Accommodating the gate in a recess that is formed in the electron supply layer to make this layer thinner at the recessed part.

2. Interposing a p-type nitride semiconductor layer between the gate and the electron supply layer (Japanese Unexamined Patent Publication No. 2004-273486).

3. Accommodating the gate in the recess (ditto) in the electron supply layer via an insulating film of strontium titanate or the like (Japanese Unexamined Patent Publication No. 2006-222414).

4. Partly removing the electron supply layer to expose part of the underlying electron transit layer and placing the gate on the exposed part of the electron transit layer via an insulating film (WO 2003/071607).

The first cited known scheme is designed to weaken the electric field due to the piezoelectric and spontaneous depolarizations at and adjacent the part of the electron supply layer that has become thin by recessing. The weaker electric field is cancelled out by the built-in potential of the device, that is, the potential difference between the gate and the electron supply layer when no bias voltage is being applied to the gate. The result is the disappearance of the 2DEG from the neighborhood of the gate. The remaining 2DEG is unable to convey source-drain current while no voltage is being applied to the gate. The device is therefore normally off.

The HEMT built on this first known scheme had several shortcomings. First, it had a threshold voltage as low as one volt or even less and so was easy to be triggered into action by noise. What was worse, this threshold changed substantively with manufacturing errors in the depth of the recess in the electron supply layer. Another weakness was that there was a relatively large current leakage upon application of a positive voltage to the Schottky gate. Creating the recess in the electron supply layer brought about the additional weakness that the resulting thin part of the electron supply layer was not necessarily satisfactory in its capability of supplying a sufficient amount of electrons to the electron transit layer when a voltage was applied to the gate in order to turn the device on. The fact that the 2DEG channel was partly insufficient in electron density made the turn-on resistance of the device inordinately high.

The provision of the p-type semiconductor layer under the gate according to the second known suggestion above serves to raise the potential of the underlying part of the electron transit layer. The resulting depletion of electrons from under the gate creates a hiatus in the 2DEG layer, making the device normally off.

An objection to this second known suggestion is the difficulty of creating the p-type nitride semiconductor layer of the sufficiently high hole density required. In cases where this requirement was not met, then it became necessary either to make the electron supply layer thinner or, if the electron supply layer was made from AlGaN or aluminum indium gallium nitride (AlInGaN), to lower its aluminum content. The result in either case was a drop in the electron density of the 2DEG layer, which in turn made higher the source-drain turn-on resistance.

The third known solution also seeks to gain normally-off performance by making the electron supply layer thinner under the gate by creating a recess in that layer. By receiving the gate in this recess via the insulating film, the HEMT is saved from a rise in current leakage and made higher in transconductance (symbol $g_m$).

Having a recess in the electron supply layer, this prior art normally-off HEMT possesses the same shortcomings as the first described one. As an additional disadvantage, the insulating film was susceptible to physical defects, particularly when made thinner for a higher transconductance. A defective insulating film was a frequent cause of current leakage, lower antivoltage strength, device destruction, and current collapse. All these results would be avoidable by making the insulating film thicker, but then the device would be inconveniently low in transconductance.

With the gate placed on the exposed part of the electron transit layer via an insulating film as in the fourth known solution above, the 2DEG in the electron transit layer is normally absent from under the gate. A problem with this prior art device arose when the gate was excited to turn it on. Its turn-on resistance was higher than the more conventional normally-on HEMT by reason of the absence of the 2DEG from under the gate.

The difficulties and inconveniences pointed out hereinbefore in conjunction with the known normally-off field-effect semiconductor devices are not limited to HEMTs alone. Similar problems have attended the conventional endeavors to provide other types of normally-off 2DEG diodes and MESFETs and like field-effect semiconductor devices other than HEMTs.

SUMMARY OF THE INVENTION

It is among the objects of this invention to render field-effect semiconductor devices of the kind defined, capable of operation in normally-off mode without the difficulties and inconveniences experienced heretofore, while keeping their on-resistance and gate leak current significantly less than in the comparable prior art devices.

Another object of the invention is to provide a method of most expediently fabricating field-effect semiconductor devices that meet the requirements of the first recited object.

Briefly, the present invention may be summarized in one aspect thereof as a field-effect semiconductor device comprising a main semiconductor region having a first and a second semiconductor layer of dissimilar semiconducting materials such that a two-dimensional charge carrier (i.e., electrons or holes) gas layer is generated in the first semiconductor layer along the heterojunction between the first and the second semiconductor layer. A first and a second main electrode (e.g., source and drain electrodes) are disposed in spaced-apart positions on a major surface (where the second semiconductor layer is exposed) of the main semiconductor region and electrically coupled to the two-dimensional carrier gas layer in the first semiconductor layer of the main semiconductor region. Between these electrodes and on the major surface of the main semiconductor region is a gate electrode for controlling conduction between the first and the second main electrode via the two-dimensional carrier gas layer. A metal oxide semiconductor film is disposed between the gate electrode and the main semiconductor region, the metal oxide semiconductor film having a conductivity type such that the charge carriers are depleted from under the semiconductor film, with the consequent creation of a depletion zone in the two-dimensional carrier gas layer. An insulating film is also disposed between the gate electrode and the main semiconductor region.

The insulating film lies between the main semiconductor region and the metal oxide semiconductor film in one embodiment of the invention, and between the metal oxide semiconductor film and the gate electrode in another. In still another embodiment one insulating film lies in one of these two locations, and another similar insulating film in the other location.

Preferably, the main semiconductor region has formed therein a recess extending from the major surface thereof and terminating short of the first semiconductor layer thereof. The gate electrode is received in the recess via the metal oxide semiconductor film and the insulating film. It is also preferred that two other recesses be formed in the major surface of the main semiconductor region to receive the two main electrodes.

The principles of the present invention are herein disclosed as applied to HEMTs, or HEMT-like devices to be more exact, in most of the embodiments to be presented subsequently. In the case of a HEMT the first and the second semiconductor layer of the main semiconductor region take the form of an electron transit layer and electron supply layer, respectively. The gate electrode controls conduction between a source and a drain electrode (referred to as the main electrodes in the foregoing summary) via the 2DEG in the electron transit layer. Underlying the gate electrode, the metal oxide semiconductor layer of p-type conductivity is effective to introduce a break in the 2DEG layer, making the HEMT normally off.

The present invention also provides a method of making the normally-off field-effect semiconductor device of the kind wherein the main semiconductor region has one or more recesses formed in its third semiconductor to receive at least the gate electrode or all of the gate electrode and two main electrodes. According to the method, the first and the second semiconductor layer are first formed successively on a substrate. Then prescribed part or parts of the exposed surface of the second semiconductor layer are masked with a growth barrier or barriers capable of preventing semiconductor growth thereon. Then the third semiconductor layer of the main semiconductor region is grown on other than the masked part or parts of the surface of the second semiconductor layer. Then the growth barrier or barriers are etched away with the consequent creation of a recess or recesses in the third semiconductor layer. Then the main electrodes are formed either on the surface of the main semiconductor region or in two of the recesses in the third semiconductor layer, and the gate electrode is formed in the other recess via the metal oxide semiconductor film and at least one insulating film.

The above summarized method offers the benefit of the ease with which the recess or recesses are formed in the main semiconductor region. Moreover, the part or parts of the surface of the second semiconductor layer forming the bottom of the recess or recesses suffer little or no physical impairment from the creation of the recess or recesses in the third semiconductor layer.

The following is a list of most pronounced advantages won by the present invention:

1. The metal oxide semiconductor film is easy of fabrication and chemically stable as well. Endowed with a required conductivity type, the metal oxide semiconductor layer functions to deplete the charge carriers at the underlying part of the two-dimensional carrier gas layer, holding the device normally off, or nearly so at worst, by reason of the depletion zone thus created in the two-dimensional carrier gas.

2. The concentration of charge carriers (e.g., holes) in the metal oxide semiconductor film is easy of enhancement. The metal oxide semiconductor film of higher carrier density is more effective for depletion of the charge carriers from the neighboring part of the two-dimensional carrier gas.

3. The metal oxide semiconductor film fabricated as taught in the subsequent detailed description is so electrically resistive that it effectively limits current flow through the gate electrode when the device is off.

4. Interposed between metal oxide semiconductor film and main semiconductor region and/or between gate electrode and metal oxide semiconductor film, the insulating film or films serve for further reduction of gate leak current.

The above and other objects, features and advantages of this invention will become more apparent, and the invention itself will best be understood, from a study of the following description and appended claims, with reference had to the attached drawings showing some preferable embodiments of the invention.

BRIEF DESCRIPTION OF THE DRAWINGS

FIG. 5 is a diagrammatic sectional illustration of still another step in the fabrication of the normally-off heterojunction field-effect semiconductor device of FIG. 1, in which a second electron supply layer and cap layer are successively grown by epitaxy on the unmasked surface parts of the first electron supply layer in the article of FIG. 4.

FIG. 6 is a diagrammatic sectional illustration of yet another step in the fabrication of the normally-off heterojunction field-effect semiconductor device of FIG. 1, in which the growth barriers are etched away from the article of FIG. 4 with the consequent creation of recesses in the second electron supply layer and cap layer.

FIG. 7 is a diagrammatic sectional illustration of a further step in the fabrication of the normally-off heterojunction field-effect semiconductor device of FIG. 1, in which source and drain electrodes are formed in two of the three recesses in the article of FIG. 6.

FIG. 8 is a diagrammatic sectional illustration of a further step in the fabrication of the normally-off heterojunction field-effect semiconductor device of FIG. 1, in which a protective film of electrically insulating material is formed on the article of FIG. 7, leaving the remaining third recess exposed.

DESCRIPTION OF THE PREFERRED EMBODIMENTS

General

Figure 1:
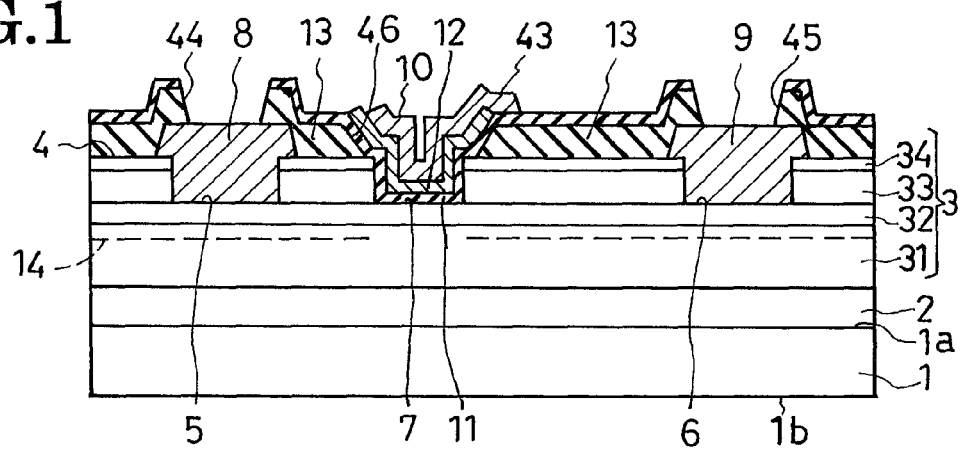
FIG. 1 is a diagrammatic sectional illustration of the normally-off heterojunction field-effect semiconductor device embodying the novel concepts of this invention.

The principles of the present invention are believed to be best embodied in the heterojunction field-effect semiconductor device illustrated in FIG. 1 of the drawings. The illustrated device is akin in operating principle to the conventional HEMT but structurally differs therefrom in gate insulation.

The representative device includes a substrate 1 of semiconducting monocrystalline silicon having a pair of opposite major surfaces $1_a$ and $1_b$. Grown on the major surface $1_a$ of the substrate 1 via a buffer 2 is a main semiconductor region 3 which is shown configured to provide the essential working parts of a HEMT, as will be detailed subsequently. The main semiconductor region 3 has a major surface 4 facing away from the substrate 1.

The main semiconductor region 3 has a first recess 5, second recess 6 and third recess 7 formed in its major surface 4 to accommodate parts of a source electrode 8, drain electrode 9 and gate electrode 10, respectively. There are interposed between main semiconductor region 3 and gate electrode 10 an electrically insulating film 11 and, thereover, a p-type metal oxide semiconductor film 12. Additionally, a protective film 13 of electrically insulating material overlies the unrecessed part of the major surface 4 of the main semiconductor region 3.

The insulating film 11, p-type metal oxide semiconductor film 12 and gate electrode 10 are all received in part in the third recess 7 in the main semiconductor region 3 and placed in that order one on top of another, constituting in combination a most pronounced feature of the instant invention. A more detailed explanation of FIG. 1 follows.

Substrate

The substrate 1 serves both as a basis for epitaxially growing the buffer 2 and main semiconductor region 3 thereon and, upon completion of these parts, as a mechanical support therefor and all the other overlying parts. The substrate 1 is made from silicon for economy in this particular embodiment but could be made from other materials including semiconductors such as silicon carbide, and insulators such as sapphire and ceramics.

The buffer 2 on the major surface $1_a$ of the substrate 1 may be grown in vapor phase by any known or suitable method such as metalorganic chemical vapor deposition (MOCVD) also known as metalorganic vapor phase epitaxy (MOVPE). The buffer 2 may be either mono- or multi-layered. The multilayer option may comprise, for example, a desired number of alternations of an aluminum nitride (AlN) layer and a gallium nitride (GaN) layer. Other semiconducting materials are employable, including nitrides other than AlN and GaN, and Groups III-V compound semiconductors. Being not too closely associated with the operation of the HEMT-type field-effect semiconductor device, however, the buffer 2 is eliminable.

Main Semiconductor Region

Directly overlying the buffer 2 is the main semiconductor region 3 which in this particular embodiment comprises an electron transit layer 31, a first electron supply layer 32, a second electron supply layer 33, and a cap layer 34, deposited in that order on the major surface $1_a$ of the substrate 1 via the buffer 2. What follows is a more detailed description of these constituent layers 31-34 of the main semiconductor region 3.

The electron transit layer 31 of the main semiconductor region 3 is made by MOCVD from undoped GaN to a thickness of, say, 0.3-10.0 micrometers. As indicated by the broken line labeled 14, the electron transit layer 31 provides, under the influence of the overlying electron supply layer 32 yet to be detailed, the aforesaid 2DEG adjacent the heterojunction between these layers 31 and 32. The 2DEG 14 serves as the current channel between the source and drain electrodes 8 and 9.

The electron transit layer 31 may be made from other compound semiconductors notably including the nitride semiconductors that are generally expressed as:

$$Al_a In_b Ga_{1-a-b} N$$

where the subscripts a and b are both numerals that are equal to or greater than zero and less than one.

The first electron supply layer 32 of the main semiconductor region 3 is grown by MOCVD on the electron transit layer 31 to a thickness of 5-10 nanometers, seven nanometers for the best results, using a semiconducting nitride. The first electron supply layer 32 is greater in bandgap, and less in lattice constant, than the electron transit layer 31. The first electron supply layer 32 may be made from undoped $Al_x Ga_{1-x} N$, where x is a numeral in the range of 0.1-0.4. The particular material employed for the first electron supply layer 32 in this embodiment of the invention is $Al_{0.26}Ga_{0.74}N$ (x=0.26).

Other semiconducting nitrides are adoptable for the first electron supply layer 32 as well, such as those generally defined as:

$$Al_x In_y Ga_{1-x-y} N$$

where the subscript x is a numeral that is greater than zero and less than one, preferably in the range of 0.1 through 0.4, and the subscript y is a numeral that is equal to or greater than zero and less than one. Additionally, the first electron supply layer 32 may be made from semiconducting nitrides other than $Al_x Ga_{1-x} N$ or $Al_x In_y Ga_{1-x-y} N$, or even from other semiconducting compounds. It is also possible to introduce n-type impurities into the first electron supply layer 32.

The second electron supply layer 33 of the main semiconductor region 3 is also fabricated by depositing a semiconducting nitride on the first electron supply layer 32 to a thickness of 3-25 micrometers, 18 nanometers for the best results, by MOCVD. The second electron supply layer 33 is greater in bandgap, and less in lattice constant, than the electron transit layer 31. The second electron supply layer 33 may be made from undoped $Al_x Ga_{1-x} N$, where x is a numeral in the range of 0.2-0.5. In any event the aluminum proportion x of the second electron supply layer 33 should be greater than, or at least equal to, that of the first electron supply layer 32. The particular material employed for the second electron supply layer 33 in this embodiment of the invention is $Al_{0.30}Ga_{0.70}N$ (x=0.30). As required, for a higher carrier (electron) concentration, n-type impurities may be added to the second electron supply layer 33.

Other semiconducting nitrides may be employed for the second electron supply layer 33, such as those generally defined as:

$$Al_x In_y Ga_{1-x-y} N$$

where the subscript x is a numeral that is greater than zero and less than one, preferably in the range of 0.2 through 0.5, and the subscript y is a numeral that is equal to or greater than zero and less than one. Additionally, the second electron supply layer 33 may be made from semiconducting nitrides other than $Al_x Ga_{1-x} N$ or $Al_x In_y Ga_{1-x-y} N$, or even from other semiconducting compounds.

The cap layer 34 is grown on the second electron supply layer from a semiconducting nitride to possess a carrier (electron) concentration less than that of the second electron supply layer 33. MOCVD is adopted here again for fabricating the cap layer 34 from $Al_x Ga_{1-x} N$ where the subscript x is in the range of 0-0.50. The particular material employed for the second cap layer 34 in this embodiment is GaN (x=0). The thickness of the cap layer 34 may be 1-150 nanometers, preferably 2-10 nanometers. The cap layer 34 of this particular embodiment is four nanometers thick.

Semiconducting nitrides other than $Al_x Ga_{1-x} N$ are adoptable for the cap layer 34 as well, such as those generally defined as:

$$Al_x In_y Ga_{1-x-y} N$$

where the subscript x is a numeral that is greater than zero and less than one, preferably in the range of 0.00 through 0.50, and the subscript y is a numeral that is equal to or greater than zero and less than one. Additionally, the cap layer 34 may be made from semiconducting nitrides other than either $Al_x Ga_{1-x} N$ or $Al_x In_y Ga_{1-x-y} N$, or even from other semiconducting compounds. It is also possible to introduce n-type impurities into the cap layer 34. Being not closely associated with the intrinsic operation of this heterojunction field-effect semiconductor device, however, the cap layer 34 is omissible.

With continued reference to FIG. 1 the three recesses 5-7 are formed in the major surface 4 of the main semiconductor region 3 for receiving the electrodes 8-10. All these recesses 5-7 extend throughout the cap layer 34 and second electron supply layer 33 to expose parts of the surface of the first electron supply layer 32. All these recesses 5-7 are spaced from one another, with the third recess 7, receiving the gate electrode 10, interposed between the first and second recesses 5 and 6.

Source and Drain Electrodes

The source electrode 8 and drain electrode 9 are received in part in the first and second recesses 5 and 6, respectively, in the main semiconductor region 3, making ohmic contact with the first electron supply layer 32 exposed at the bottoms of these recesses Each of these electrodes 8 and 9 may be a lamination of a titanium layer with a thickness of 25 nanometers and an aluminum layer with a thickness of 300 nanometers. The first electron supply layer 32 of the main semiconductor region 3 intervenes between the source and drain electrodes 8 and 9 and the 2DEG 14 in the electron transit layer 31. However, so thin being the first electron supply layer 32, the electrodes 8 and 9 are both electrically coupled therethrough to the 2DEG 14.

Alternatively, the recesses 5 and 6 may be formed so deep as to reach the electron transit layer 31 thereby making it possible to place the source and drain electrodes 8 and 9 in direct contact with that layer 31. As another alternative, the recesses 5 and 6 may not be formed at all in the main semiconductor region 3, and the source and drain electrodes 8 and 9 may be placed upon the cap layer 34, as in one of the embodiments of the invention to be presented subsequently. A further alternative is possible in which the recesses 5 and 6 are made so shallow as to terminate short of the first electron supply layer 32, and the source and drain electrodes 8 and 9 may be disposed upon the remaining parts of the second electron supply layer 33. Also, the source and drain electrodes 8 and 9 may be made from a metal or metals other than titanium and aluminum.

Gate Electrode

The gate electrode 10 is received in part in the third recess 7 in the main semiconductor region 3 via the insulating film 11 and p-type metal oxide semiconductor film 12. So positioned, the gate electrode 10 is designed to control current flow between source electrode 8 and drain electrode 9 by way of the 2DEG 14.

Figure 2:
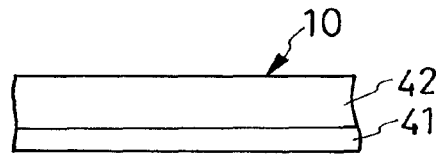
FIG. 2 is an enlarged, fragmentary sectional view of the gate electrode of the normally-off heterojunction field-effect semiconductor device of FIG. 1.

As illustrated fragmentarily and on an enlarged scale in FIG. 2, the gate electrode 10 of this particular embodiment is a lamination of a nickel layer 41 and gold layer 42. The nickel layer 41 of the gate electrode 10 is sputtered on the p-type metal oxide semiconductor film 12 (made from nickel oxide in this embodiment) to a thickness of 30 nanometers. The gold layer 42 of the gate electrode 10 is vapor deposited on the nickel layer 41 to a thickness of 300 nanometers. The illustrated arrangement of the nickel oxide semiconductor film 12, nickel layer 41 and gold layer 42 is desirable from the standpoint of less gate leak current. Alternatively, the gate electrode 10 may be either a lamination of nickel, gold and titanium layers, or a single layer of aluminum, or that of electrically conducting polysilicon.

With reference back to FIG. 1 the gate electrode 10 is formed to include an extension 43 toward the drain electrode 9. Overlying the major surface 4 of the main semiconductor region 3, the gate electrode extension 43 is designed to function as a so-called field plate, mitigating the field concentration along the edge of the gate electrode 10. It will be observed from FIG. 1 that the protective film 13 has an opening created therethrough in register with the third recess 7 in the main semiconductor region 3. The surfaces of the protective film 13 defining this opening are each at an angle of 5-60 degrees to the major surface 4 of the main semiconductor region 3. Joined to the gate electrode 10 over the topmost extremity of one of these slanting surfaces of the protective film 13, the gate electrode extension or field plate 43 effectively diminishes the edgewise field concentration of the gate electrode 10.

The provision of the third recess 7 is not an essential feature of this invention, as that of the first and second recesses 5 and 6 is not, either. This third recess 7 will be unnecessary in cases where the device can be rendered normally off, or nearly so, without it. In the absence of the recess 7 the gate electrode 10 may be disposed on the cap layer 34. As another alternative the third recess 7 may be made so shallow as to terminate short of the first electron supply layer 32, and the gate electrode 10 may be placed on the second electron supply layer 33 via the insulating film 11 and protective film 13.

For reduction of gate leak current the insulating film 11 is received in part in the third recess 7 in the main semiconductor region 3 and therein sandwiched between the p-type metal oxide semiconductor film 12 and the first electron supply layer 32 of the main semiconductor region 3 in this particular embodiment of the invention. Further the insulating film 11 extends over the sides of the third recess 7 onto the protective film 13. The insulating film 11 should be so thin (e.g., 3-200 nanometers, preferably 100 nanometers or so) as not to interfere with the desired field effect offered by the gate electrode 10.

The insulating film 11 must be higher in resistivity than the p-type metal oxide semiconductor film 12. Usually, the insulating film 11 is made from insulators such as the oxides of silicon and metallic elements. Hafnium oxide, $HfO_2$, is the particular substance employed for the insulating film 11 in this embodiment of the invention.

The p-type metal oxide semiconductor film 12 is intended to lower the electron concentration of that part of the electron transit layer 32 of the main semiconductor region 3 which underlies the gate electrode 10. Disposed between gate electrode 10 and insulating film 11 in the third recess 7 in the main semiconductor region 3, the p-type metal oxide semiconductor film 12 is formed to include portions held via the insulating film 11 against the surfaces of the protective film 13 defining the noted opening therein in register with the third recess 7. The p-type metal oxide semiconductor film 12 is made from a semiconducting oxide of a metal and is higher in resistivity than either of the two electron supply layers 33 and 34. The thickness of this semiconductor film 12 may be 3-1000 nanometers, preferably 20-500 nanometers. Should it be less than about three nanometers thick, the semiconductor film 12 might fail to render the device normally off.

The p-type metal oxide semiconductor film 12 may be made from any of the class of nickel oxides that are generally defined as $NiO_x$ where the subscript x is an arbitrary number such as one. More specifically, for fabrication of the semiconductor film 12, a layer of $NiO_x$ may be first created by sputtering nickel oxide, NiO, in an oxygen-containing atmosphere such as a mixture of argon and oxygen. Oxygen ions may then be implanted into this $NiO_x$ layer.

So made, the p-type metal oxide semiconductor film 12 will be sufficiently high in both oxygen and hole concentrations to cause a drop in electron concentration at that part of the electron transit layer 31 of the main semiconductor region 3 which underlies the gate electrode 10. This drop in electron concentration is tantamount to the creation of a hiatus or gap in the 2DEG 14 under the gate electrode 10. There is thus obtained a normally-off (or low-threshold) heterojunction HEMT or HEMT-like field-effect semiconductor device.

The p-type metal oxide semiconductor film 12 need not necessarily be formed to include portions overlying the protective film 13. Also, instead of nickel oxide, the semiconductor film 12 may be made from any one or more of iron oxide ($FeO_x$ where x is a numeral such for example as two), cobalt oxide ($CoO_x$ where x is a numeral such for example as two), manganese oxide ($MnO_x$ where x is a numeral such as one), and copper oxide ($CuO_x$ where x is a numeral such as one). It is recommended that the semiconductor film 12 be made from these alternative metal oxides by sputtering in an oxygen-containing atmosphere.

The protective film 13 covers the major surface 4 of the main semiconductor region 3 except where the three recesses 5-7 are formed. The protective film 13 is made from any of the silicon oxides that are generally defined as $SiO_x$ where x is a numeral in the range of 1-2, preferably two. The protective film 13 may be fabricated by plasma chemical vapor deposition (CVD) to a thickness of 300-2000 nanometers, typically about 500 nanometers.

The protective film 13 serves not simply to protect the main semiconductor region 3 electrically, chemically and mechanically but further to add to the electron concentration of the 2DEG 14. Fabricated as above, the protective film 13 will develop a compressive stress or strain of, say, $4.00 \times 10^9$ dyn/cm$^2$, which will act on the underlying electron supply layers 32 and 33. These layers 32 and 33 will then react by developing an expansive or tensile stress. The piezoelectric depolarization of the electron supply layers 32 and 33 will thus be accelerated for a higher electron density of the 2DEG 14. The higher electron density of the 2DEG 14 is desirable for reduction of the source-drain resistance when the heterojunction field-effect semiconductor device is on.

Possibly, the silicon oxide protective film 13 might be formed by some other method such as sputtering. Plasma CVD is by far the most desirable, however, in consideration of less damage to the crystal structure at the surface 14 of the main semiconductor region 3, less surface states or traps, and avoidance of current collapse. It is also possible to fabricate the protective film 13 from silicon nitride or other insulating materials other than silicon oxide.

Both insulating film 11 and protective film 13 have openings therethrough at 44 and 45. The source electrode 8 and drain electrode 9 are exposed through these openings 44 and 45.

Method of Fabrication

Figure 3:
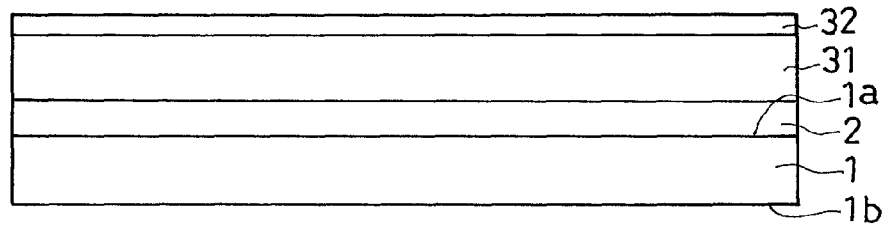
FIG. 3 is a diagrammatic sectional illustration showing a buffer, electron transit layer, and first electron supply layer successively grown by epitaxy on a substrate as a first step in the fabrication of the normally-off heterojunction field-effect semiconductor device of FIG. 1.

Pictured in FIGS. 3-11 are the sequential steps of making the HEMT-like heterojunction field-effect semiconductor device of the construction hereinbefore described with reference to FIGS. 1 and 2. With reference first to FIG. 3 there is first prepared the substrate 1 having the pair of opposite major surfaces $1_a$ and $1_b$. Then, as drawn also in FIG. 3, the buffer 2, electron transit layer 31 and first electron supply layer 32 are conventionally grown by epitaxy in that order on the first major surface $1_a$ of the substrate 1.

Figure 4:
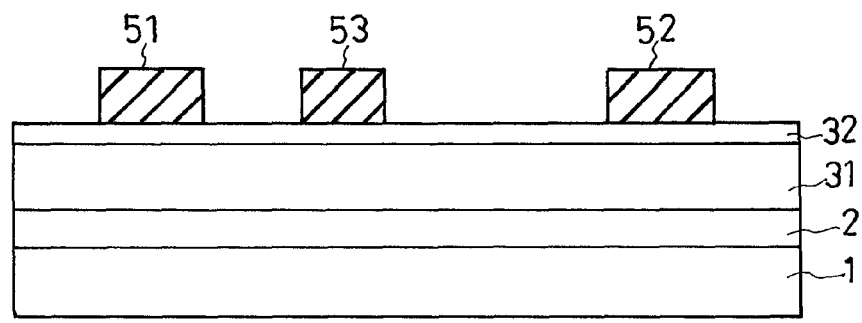
FIG. 4 is a diagrammatic sectional illustration of another step in the fabrication of the normally-off heterojunction field-effect semiconductor device of FIG. 1, in which growth barriers are formed on the article of FIG. 3 for partly masking the surface of the first electron supply layer.

The next step, illustrated in FIG. 4, is the creation of growth barriers 51, 52 and 53 in those positions of the surface of the first electron supply layer 32 where the source electrode 8, drain electrode 9 and gate electrode 8, all seen in FIG. 1, are to be formed. These growth barriers 51-53 may be created by first depositing a growth barrier layer, not shown, of silicon oxide on the entire surface of the first electron supply layer 32 and then by photolithographically removing undesired parts of the growth barrier layer. The growth barriers 51-53 can be made not only from silicon oxide but from polycrystalline semiconductors or any other material capable of blocking the growth of nitride semiconductors. The thickness or height of the growth barriers 51-53 should be not less than the total thickness of the second electron supply layer 33, FIG. 1, and cap layer 34 which are to be grown subsequently on the exposed surface of the first electron supply layer 32 as in FIG. 5.

Then the second electron supply layer 33 and cap layer 34 are successively grown by epitaxy on the first electron supply layer 32 as in FIG. 5. Because of the presence of the growth barriers 51-53 on the first electron supply layer 32, the second electron supply layer 33 and cap layer 34 will grow only on those surface parts of the first electron supply layer 32 which are left exposed by the growth barriers 51-53.

FIG. 6 shows the recesses 5-7 created in the second electron supply layer 33 and cap layer 34 as the growth barriers 51-53 are subsequently etched away or otherwise removed. Use of the growth barriers 51-53 as above is preferred by reason of the relative ease with which the recesses 5-7 are formed. Another advantage is that the first electron supply layer 32 has its surface parts practically totally unimpaired on exposure through the recesses 5-7.

Then comes the step of fabricating, as in FIG. 7, the source electrode 8 and drain electrode 9 in the first and second recesses 5 and 6, respectively, in the main semiconductor region 3. Toward this end an ohmic metal may first be deposited in vapor phase on the entire major surface 4 of the main semiconductor region 3 and, through the recesses 5-7, on the first electron supply layer 32 of the main semiconductor region. Then the metal deposit may be selectively removed by photolithography, leaving only the source electrode 8 and drain electrode 9 in the recesses 5 and 6 in the main semiconductor region 3.

Then, for creation of the protective film 13 of electrically insulating material as in FIG. 8, silicon oxide may be deposited on the entire exposed surface of the article of FIG. 7. Then the opening 46 may be formed in the metal deposit in register with the third recess 7 in the main semiconductor region 3. There is now created the protective film 13 which covers the first major surface 4 of the main semiconductor region 3 as well as the electrodes 8 and 9 in its recesses 5 and 6. Then, for better ohmic contact of the source electrode 8 and drain electrode 9 with the main semiconductor region 3, the article of FIG. 8 may be heated to 500° C. and held at this temperature for 30 minutes.

Figure 9:
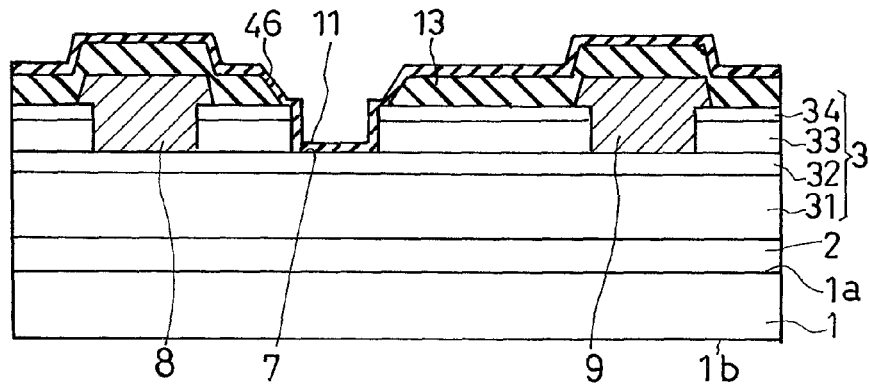
FIG. 9 is a diagrammatic sectional illustration of a further step in the fabrication of the normally-off heterojunction field-effect semiconductor device of FIG. 1, in which an insulating film is formed on all the exposed surfaces of the article of FIG. 8 including the surfaces defining the third recess.

FIG. 9 indicates at 11 the insulating film subsequently deposited on the article of FIG. 8. The insulating film 11 covers not only the protective film 13 but the surfaces of the main semiconductor region 9 defining the third recess 7 therein.

Figure 10:
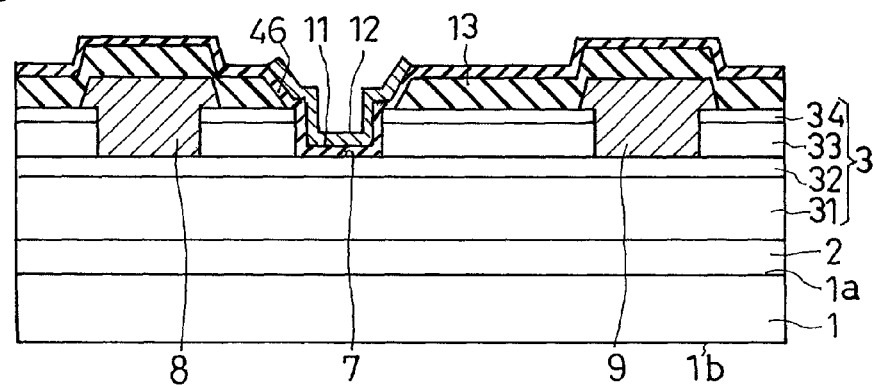
FIG. 10 is a diagrammatic sectional illustration of a further step in the fabrication of the normally-off heterojunction field-effect semiconductor device of FIG. 1, in which a p-type metal oxide semiconductor film is formed on the insulating film within the third recess in the article of FIG. 9.

Then, as pictured in FIG. 10, there is formed by the familiar lift-off process the p-type metal oxide semiconductor film 12 which is received in part in the third recess 7 in the main semiconductor region 3 via the insulating film 11. The lift-off process is such that a sacrificial resist layer, not shown, is first deposited on the entire insulating film 11 of the article of FIG. 9. The resist layer is patterned to define an opening in the shape of the p-type metal oxide semiconductor film 12 to be formed. Then a target material of the metal oxide semiconductor is deposited on the patterned resist layer, as well as on the insulating film 11 exposed therethrough, to a thickness of, say, 200 nanometers. Then the resist layer is washed away thereby lifting off the material that has been deposited thereon but leaving the target semiconductor film 12 as in FIG. 10.

The deposition of the metal oxide semiconductor layer itself on the resist layer in the above lift-off process may be done by magnetron sputtering of nickel oxide for the best results. Nickel oxide may be sputtered to the required thickness by a magnetron sputtering apparatus in an oxygen-containing atmosphere (preferably a mixture of argon and oxygen).

A reconsideration of FIG. 10 will reveal that, after the subsequent lift-off process, the completed p-type metal oxide semiconductor film 12 is held not only against the main semiconductor region surfaces bounding the third recess 7 via the insulating film 11 but, via the same insulating film, against the protective film surfaces bounding the opening therein.

Optionally, oxygen ions may be implanted into the p-type metal oxide semiconductor film 12 for a higher hole concentration. Such oxygen ion implantation is possible either before or after the lift-off of undesired parts of the metal oxide semiconductor layer that has been sputtered or otherwise deposited on the article of FIG. 9. As another alternative, the p-type metal oxide semiconductor film 12 may be created not by depositing a metal oxide but by first depositing a metal and then by oxidizing the metal deposit. It is also envisaged within the scope of this invention to add to the p-type conductivity of the metal oxide semiconductor film 12 by any such known or suitable method as heat treatment, ozone ashing, or molecular oxygen ashing.

Figure 11:
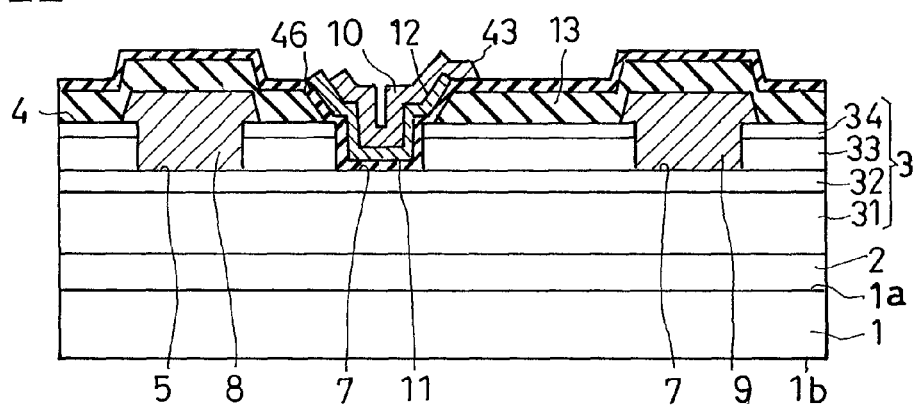
FIG. 11 is a diagrammatic sectional illustration of a still further step in the fabrication of the normally-off heterojunction field-effect semiconductor device of FIG. 1, in which a gate electrode is formed in the third recess via the insulating film and p-type metal oxide semiconductor film.

Then, as depicted in FIG. 11, the gate electrode 10 with its field plate extension 43 may be fabricated on the p-type metal oxide semiconductor film 12 that has been made as in FIG. 10. The lift-off process is also employable here. Namely, a sacrificial resist layer may first be deposited on the entire surfaces of the insulating film 11 and metal oxide semiconductor film 12 of the article of FIG. 10. The resist layer is patterned to possess an opening in the shape of the gate electrode 10 as well as the field plate extension 43 to be formed. Then a target material of the gate electrode is deposited on the patterned resist layer. Then the resist layer is washed away thereby lifting off the material that has been deposited thereon and leaving the target gate electrode 10 with the field plate extension 43 as in FIG. 11.

The final step is the selective removal of the insulating film 11 and protective film 13 to create openings therethrough for exposing the source electrode 8 and drain electrode 9. These openings are seen at 44 and 45 in FIG. 1. Now has been completed the fabrication of the normally-off heterojunction field-effect semiconductor device.

Operation

FIG. 1 represents the normal state of the device, when no control voltage is impressed to the gate electrode 10. There is little or no current flow between source electrode 8 and drain electrode 9 when there is no potential difference between source electrode 8 and gate electrode 10 and when the drain electrode 9 is higher in potential than the source electrode 8. The 2DEG 14 is now open or nearly so for the following reasons.

The gate electrode 10 is received in the third recess 7 created by removing parts of the second electron supply layer 33 and cap layer 34. These layers 33 and 34 are therefore absent from between gate electrode 10 and electron transit layer 31; only the p-type metal oxide semiconductor film 12 and first electron supply layer 32 exist therebetween. The first electron supply layer 32 is so thin, and its piezoelectric and spontaneous polarizations consequently so weak, that the electron (carrier) concentration of the electron transit layer 31 lowers under the gate electrode 10.

It is undesirable, however, that the first electron supply layer 32 be made excessively thin with a view to minimal on-resistance between source electrode 8 and drain electrode 9. The present invention overcomes this dilemma by making the first electron supply layer 32 only so thick that it would fail to impart a favorable normally-off characteristic to the device without aid by the p-type metal oxide semiconductor film 12. With the thickness of the first electron supply layer 32 so determined, and were it not for the p-type metal oxide semiconductor film 12, some carriers (electrons) would stay in the electron transit layer 31. The p-type metal oxide semiconductor film 12 actually serves to wipe out these carriers (electrons) to make the device normally off.

Higher in resistivity than p-type gallium nitride or the like that has been conventionally used in devices of this type, the p-type metal oxide semiconductor film 12 might indeed be considered electrically insulating. Thus the p-type metal oxide semiconductor film 12 materially reduces the amount of current flowing through the gate electrode 10 in normally-off mode. Experiment has proved that the prior art HEMT having neither insulating film 11 nor p-type metal oxide semiconductor film 12 has a gate leak current of approximately $1 \times 10^{-5}$ amperes per millimeter (A/mm) when the drain-source voltage is 300 volts. By contrast, in a device having the p-type metal oxide semiconductor film 12 according to the invention but no insulating film 11, the gate leak current at the same drain-source voltage is as low as approximately $1 \times 10^{-9}$ A/mm. The gate leak current at the same drain-source voltage grows still less, to $0.7 \times 10^{-9}$ A/mm, in a device having both insulating film 11 and p-type metal oxide semiconductor film 12 as taught by the instant invention.

The results above evidence that the p-type metal oxide semiconductor film 12 functions not only to make the device normally off but additionally to lessen gate leak current. The insulating film 11 coacts with the p-type metal oxide semiconductor film 12 to further diminish the gate leak current. If made thick enough to lower the gate leak current to a desired degree, the p-type metal oxide semiconductor film 12 will not interfere with the normally-off performance of the device. This is because the p-type metal oxide semiconductor film 12 reduces the carrier (electron) population of the electron transit layer 31.

Let it be assumed that a positive gate control voltage higher than a threshold is now applied between source electrode 8 and gate electrode 10 while the drain electrode 9 is higher in potential than the source electrode 8. Thereupon the p-type metal oxide semiconductor film 12 will be so polarized that its gate electrode side is negative and its electron supply layer side positive, thereby inducing electrons in some neighboring part of the electron transit layer 31. The thus induced electrons will close the gap that has existed in the 2DEG 14 in the electron transit layer 31. Conduction will be established between source electrode 8 and drain electrode 9 as electrons flow along the path comprising the source electrode 8, first electron supply layer 32, 2DEG 14, first electron supply layer 32, and drain electrode 9. The first electron supply layer 32 is so thin that electrons traverse it by the tunnel effect.

The benefits offered by the heterojunction field-effect semiconductor device, described hereinbefore in terms of its first preferred form shown in FIG. 1, may be recapitulated as follows:

1. Interposed between gate electrode 10 and first electron supply layer 32, the p-type metal oxide semiconductor film 12 has a higher hole concentration than the p-doped gallium nitride layers conventionally used for like purposes. By virtue of this high hole concentration the p-type metal oxide semiconductor film 12 imparts a reliable normally-off performance to the device.

2. The p-type metal oxide semiconductor film 12 is so high in resistivity, or so insulating, and so thick (e.g., 10-1000 nanometers), that the device has less gate leak current and higher antivoltage strength. The threshold voltage of the device does not drop if the p-type metal oxide semiconductor film 12 is made as thick as desired for such purposes, because this film is itself capable of diminishing the carriers in the electron transit layer 31. Gate leak current will be at a minimum particularly when the p-type metal oxide semiconductor film 12 is made from $NiO_x$ and the gate electrode 10 is a lamination of nickel and gold layers as at 41 and 42 in FIG. 2.

3. A further reduction of the gate leak current is accomplished by the insulating film 11 of higher resistivity than the p-type metal oxide semiconductor film 12 disposed between main semiconductor region 3 and gate electrode 10. Moreover, overlying the first electron supply layer 32, the insulating film 11 serves the purposes of stabilizing the surface of the first electron supply layer and avoiding current collapse.

4. The p-type metal oxide semiconductor film 12 is chemically stable and so easy of fabrication.

5. The p-type metal oxide semiconductor film 12 is readily manufacturable by ion implantation of oxygen into a metal oxide. Manufactured in this manner, moreover, the p-type metal oxide semiconductor film 12 has a high hole concentration.

6. The desired normally-off performance is obtained not just by recessing the main semiconductor region 3 under the gate electrode 10 but as a result of the combination of this recessing and the provision of the p-type metal oxide semiconductor film 12. The first electron supply layer 32, partly left under the recess 7, may therefore be made as thick as 5-10 nanometers. This leads to a relatively high electron concentration of the 2DEG 14, to a relatively low on-resistance, and to a sufficiently high maximum allowable current.

7. The silicon oxide protective film 13 on the surface 4 of the main semiconductor region 3 generates a compressive stress of, say, $4.00 \times 10^9$ dyn/cm². This compressive stress acts on the cap layer 34 of the main semiconductor region to realize a high electron population of the 2DEG 14 due to the piezoelectric polarization of the two electron supply layers 31 and 32. Thus is the device made less in on-resistance than the prior art heterojunction field-effect semiconductor device having a silicon nitride film on the surface of the main semiconductor region. The protective film 13 serves the additional purpose of gate leak current reduction.

8. By virtue of the field plate extension 43 of the gate electrode 10, and of the slanting (5-60 degrees) side surfaces of the silicon oxide protective film 13 defining the opening 46, the oft-encountered field concentrations at the edges of the gate electrode are effectively alleviated, imparting a higher antivoltage strength to the device.

9. The gate field plate extension 43 serves the additional purpose of permitting the electrons that have been trapped at the surface states of the main semiconductor region 3 to be drawn therethrough to the gate electrode 10 when a reverse voltage is applied between drain and source, thereby saving the device from current collapse.

10. The p-type metal oxide semiconductor film 12 is capable of fabrication by magnetron sputtering in an oxygen-containing atmosphere to a sufficient thickness and sufficient hole concentration for the purposes of this invention.

11. The p-type conductivity (hole concentration) of the p-type metal oxide semiconductor film 12 can be easily intensified by any such known method as heat treatment, ozone ashing, or oxygen ashing.

Figure 12:
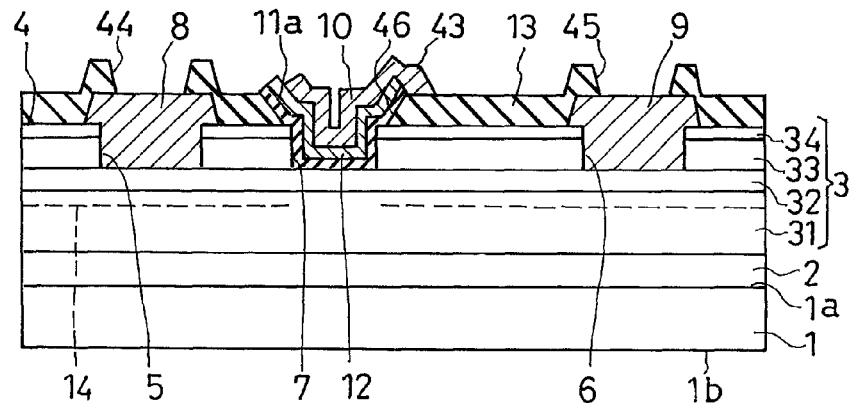
FIG. 12 is a diagrammatic sectional illustration of another preferred form of normally-off heterojunction field-effect semiconductor device according to the invention.

Embodiment of FIG. 12

The second preferred form of heterojunction field-effect semiconductor device according to the invention features a modified insulating film $11_a$, all the other details of construction being as above described with reference to FIGS. 1 and 2. The modified insulating film $11_a$ differs from its FIG. 1 counterpart 11 in underlying only the p-type metal oxide semiconductor film 12, leaving the protective film 13 exposed. Thus the insulating film $11_a$ is held against the main semiconductor region surfaces defining the third recess 7 and the protective film surfaces bounding the opening 46. Being basically of the same construction as the first disclosed embodiment of the invention, this alternate embodiment offers the same benefits therewith.

Figure 13:
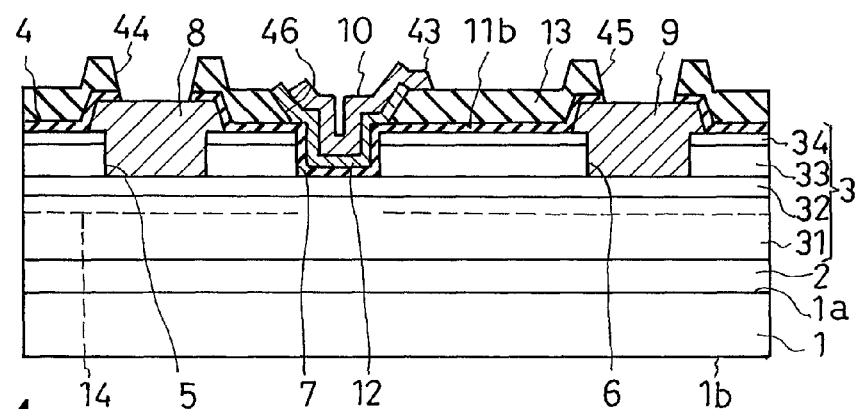
FIG. 13 is a diagrammatic sectional illustration of a further preferred form of normally-off heterojunction field-effect semiconductor device according to the invention.

Embodiment of FIG. 13

Another modified insulating film $11_b$ is the sole difference of the device shown in FIG. 13 from that of FIG. 1. The modified insulating film $11_b$ is similar to its FIG. 1 counterpart 11 in underlying the p-type metal oxide semiconductor film 12 in the third recess 7. Outside this recess 7, however, the insulating film $11_b$ underlies the protective film 13. Both made from silicon oxide, the superposed insulating film $11_b$ and protective film 13 perform the same functions as their FIG. 1 counterparts 11 and 13 despite the reversal in position.

Figure 14:
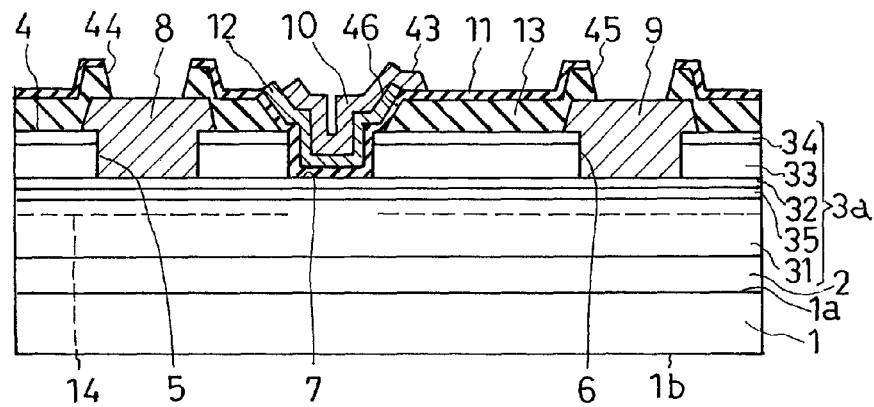
FIG. 14 is a diagrammatic sectional illustration of a further preferred form of normally-off heterojunction field-effect semiconductor device according to the invention.

Embodiment of FIG. 14

The main semiconductor region 3 of the FIG. 1 embodiment is modifiable as presented at $3_a$ in FIG. 14 without in any way affecting the desired normally-off operation of the device. The modified main semiconductor region $3_a$ features a first electron supply layer 32' of different composition from its FIG. 1 counterpart 32, and a spacer layer 35 newly inserted between the electron transit layer 31 and the first electron supply layer 32'.

Unlike its FIG. 1 counterpart 32 of undoped aluminum gallium nitride or aluminum indium gallium nitride, the first electron supply layer 32' is of n-doped aluminum gallium nitride. The spacer layer 35 on the other hand is of undoped aluminum gallium nitride and has a thickness (e.g., three nanometers) less than that (e.g., seven nanometers) of the first electron supply layer 32'. Inserted between electron transit layer 31 and first electron supply layer 32', the spacer layer 35 functions to prevent the impurities or elements of the first electron supply layer from diffusing into the electron transit layer and so save the 2DEG 14 against a drop in electron mobility. The total thickness of the first electron supply layer 32' and spacer layer 35 should be such (e.g., eight nanometers) that the device operates normally off under the influence of the p-type metal oxide semiconductor layer 12.

Despite the foregoing description the spacer layer 35 might be considered part of the electron supply layer. It is also possible to call the combination of the first electron supply layer 32' and spacer layer 35 the second semiconductor layer according to the invention. Optionally, like its FIG. 1 counterpart 32, the first electron supply layer 32' may be of undoped aluminum gallium nitride or aluminum indium gallium nitride. The spacer layer 35 may be of undoped aluminum indium gallium nitride instead of undoped aluminum gallium nitride. The insulating film 11 of this embodiment is replaceable by its FIG. 12 counterpart $11_a$ or FIG. 13 counterpart $11_b$.

The other advantages of this embodiment are considered self-evident from the foregoing description of FIG. 1.

Figure 15:
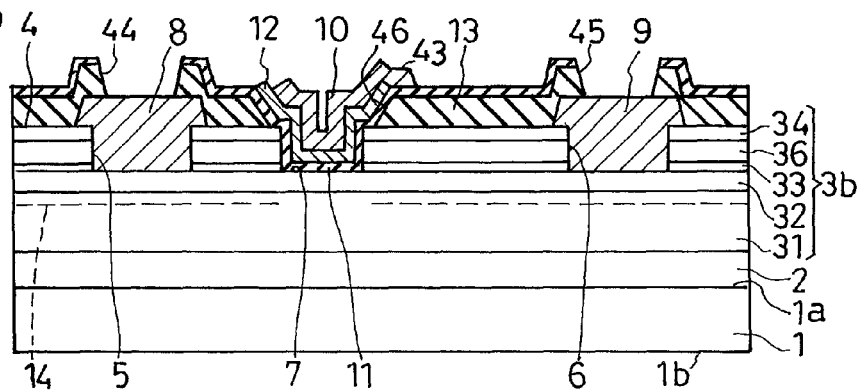
FIG. 15 is a diagrammatic sectional illustration of a further preferred form of normally-off heterojunction field-effect semiconductor device according to the invention.

Embodiment of FIG. 15

Another modified main semiconductor region is seen at $3_b$ in FIG. 15. The modified main semiconductor region $3_b$ is of the same construction as the first disclosed main semiconductor region 3, FIG. 1, except that a third electron supply layer 36 is added between second electron supply layer 33 and cap layer 34. (The third electron supply layer 36 is referred to as a fourth semiconductor layer, and the cap layer 34 as a fifth semiconductor layer, in a claim appended hereto.) This FIG. 15 embodiment is akin to that of FIG. 1 in all the other details of construction.

The third electron supply layer 36 is made from an undoped semiconducting nitride with an electron concentration less than that of the second electron supply layer 33. More specifically, the third electron supply layer 36 may be of any of the undoped semiconducting nitrides generally defined as $Al_xGa_{1-x}N$ where the aluminum proportion x is from 0.2 to 0.5 (e.g., 0.26) and less than that of the second electron supply layer 33. The thickness of the third electron supply layer 36 is 3-25 nanometers (e.g., 10 nm).

The three recesses 5-7 are all shown extending throughout the cap layer 34, third electron supply layer 36 and second electron supply layer 33. However, as required or desired, the third recess 7 may either terminate short of the second electron supply layer 33, extend into the second electron supply layer 33 but terminate short of the first electron supply layer 32, or extend into the first electron supply layer 32.

Instead of $Al_xGa_{1-x-y}N$, the third electron supply layer 36 may be made from any of the semiconducting nitrides that are generally expressed as

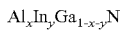

$Al_xIn_yGa_{1-x-y}N$ where the subscript x is a numeral that is greater than zero and less than one, preferably in the range of 0.2-0.5, and the subscript y is a numeral that is equal to or greater than zero and less than one.

Additionally, semiconducting nitrides or compounds other than $Al_xGa_{1-x}N$ and $Al_xIn_yGa_{1-x-y}N$ are adoptable for the third electron supply layer 36. Also, n-doped semiconducting nitrides may be employed for the third electron supply layer 36.

Further possible modifications of this embodiment include the provision of a spacer layer, similar to that seen at 35 in FIG. 14, between electron transit layer 31 and first electron supply layer 32. The insulating film 11 of this embodiment is replaceable by the insulating film $11_a$, FIG. 12, or insulating film $11_b$, FIG. 13.

Figure 16:
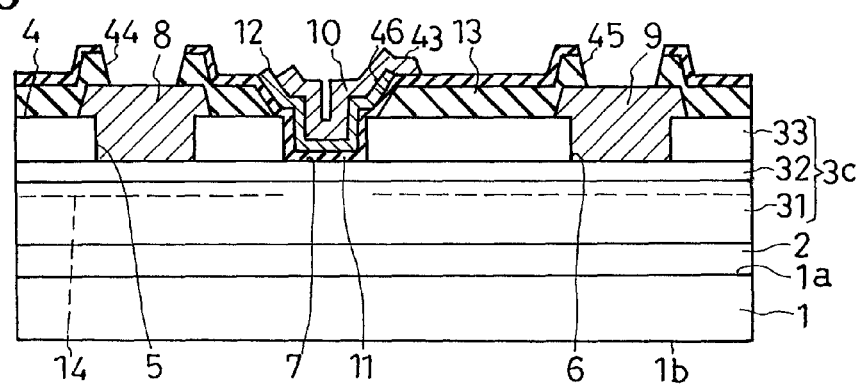
FIG. 16 is a diagrammatic sectional illustration of a further preferred form of normally-off heterojunction field-effect semiconductor device according to the invention.

Embodiment of FIG. 16

A further modified main semiconductor region 3, is the sole feature of this embodiment, all the other details of construction being as set forth above in connection with the device of FIG. 1. The modified main semiconductor region $3_c$ is itself analogous with its FIG. 1 counterpart 3 except for the absence of the cap layer 34. The second electron supply layer 33 forms the topmost layer of the main semiconductor region $3_c$, and the protective film 13 is deposited directly thereon.

Deprived of the cap layer with its benefits, this embodiment gains instead the advantage of being easier and simpler of manufacture.

Another possible modification of this embodiment is the substitution of the insulating film $11_a$, FIG. 12, or $11_b$, FIG. 13, for that shown at 11 in FIG. 16. The cap layer 34 is likewise omissible from the devices of FIGS. 14 and 15.

Figure 17:
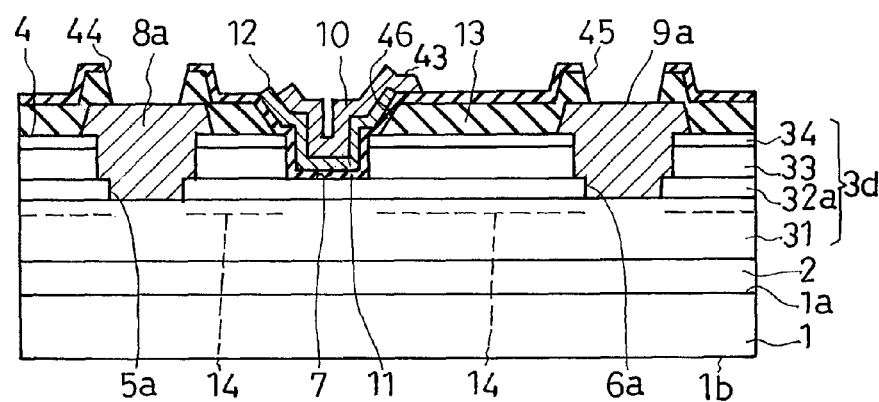
FIG. 17 is a diagrammatic sectional illustration of a further preferred form of normally-off heterojunction field-effect semiconductor device according to the invention.

Embodiment of FIG. 17

This embodiment is of the same construction as that of FIG. 1 except for some modifications in: (a) a main semiconductor region $3_d$; (b) a first recess $5_a$ and second recess $6_a$; and (c) a source electrode $8_a$ and drain electrode $9_a$. The modified main semiconductor region $3_d$ differs from its FIG. 1 counterpart 3 in having a modified first electron supply layer $32_a$. This first electron supply layer $32_a$ then differs from its FIG. 1 counterpart 32 in being recessed in register with the first and second recesses $5_a$ and $6_a$ in the second electron supply layer 33 and cap layer 34. Thus, in other words, the recesses $5_a$ and $6_a$ are made deeper, extending into and throughout the first electron supply layer $32_a$ and thereby exposing the electron transit layer 31.

Received in these deeper recesses $5_a$ and $6_a$, the source electrode $8_a$ and drain electrode $9_a$ are directly coupled to the electron transit layer 31 and hence to the 2DEG 14. Consequent drops in resistance between the electrodes $8_a$ and $9_a$ and the electron transit layer 31 lead to a significant diminution of resistance between these electrodes $8_a$ and $9_a$ when the device is on.

The teachings of this embodiment are applicable to that of FIG. 14. The recesses 5 and 6 in the main semiconductor region $3_a$ may be deepened until they reach the electron transit layer 31. The source electrode 8 and drain electrode 9 may then make direct contact with the electron transit layer 31. The device will then win the same benefits as pointed out in connection with the FIG. 17 embodiment.

In the FIG. 15 embodiment, too, the recesses 5 and 6 in the main semiconductor region $3_b$ may be etched further down to the electron transit layer 31. The source electrode 8 and drain electrode 9 will then make direct contact with the electron transit layer 31, with the consequent benefits as above.

Similarly, in the FIG. 16 embodiment, the device will gain the same advantages by having the source electrodes 8 and drain electrode 9 likewise placed in direct contact with the electron transit layer 31.

The insulating film 11 of this FIG. 17 embodiment is replaceable by that shown either at $11_a$ in FIG. 12 or at $11_b$ in FIG. 13.

Figure 18:
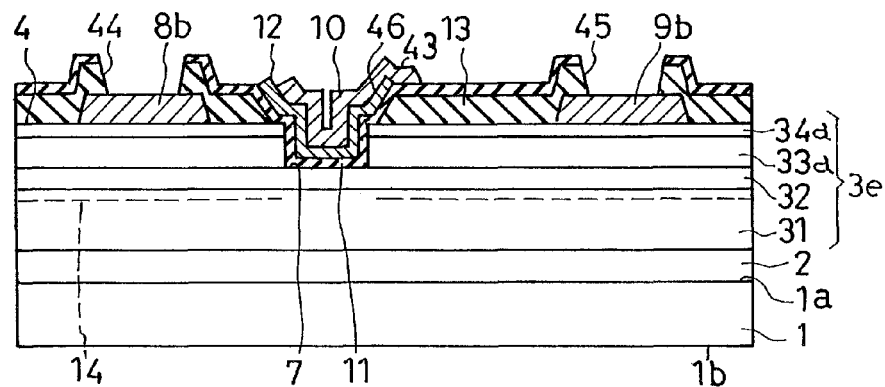
FIG. 18 is a diagrammatic sectional illustration of a further preferred form of normally-off heterojunction field-effect semiconductor device according to the invention.

Embodiment of FIG. 18

This embodiment is also similar in construction to that of FIG. 1 except for some modifications in a main semiconductor region $3_e$, source electrode $8_b$ and drain electrode $9_b$. The modified main semiconductor region $3_e$ differs from its FIG. 1 counterpart 3 in that the former has a second electron supply layer $33_a$ and cap layer $34_a$ in which there is formed only one recess 7 (equivalent to the third recess designated by the same numeral in FIG. 1). The first and second recesses 5 and 6 of the FIG. 1 embodiment are absent from the main semiconductor region $3_e$.

As in the FIG. 1 embodiment the gate electrode 10 is received in part in the third recess 7 in the main semiconductor region $3_e$ via the insulating film 11 and p-type metal oxide semiconductor film 12. The source electrode $8_b$ and drain electrode $9_b$ are both formed upon the cap layer $34_a$, so that the first and second electron supply layers 32 and $33_a$ and cap layer $34_a$ all intervene between the electrodes $8_b$ and $9_b$ and the 2DEG 14. However, the thicknesses of the intervening electron supply layers 32 and $33_a$ and cap layer $34_a$ are such that the source electrode $8_b$ and drain electrode $9_b$ are conductively coupled to the 2DEG 14.

The absence of the recesses 5 and 6 from this embodiment makes its manufacture easier. It also possesses the benefits set forth in conjunction with the FIG. 1 embodiment.

The teachings of this FIG. 18 embodiment are applicable to the embodiments of FIGS. 14, 15 and 16 as well. The recesses 5 and 6 may not be formed in the main semiconductor regions $3_a$, $3_b$ and $3_c$ of these embodiments, and the source electrode 8 and drain electrode 9 may be formed upon these main semiconductor regions.

Further possible modifications of this FIG. 18 embodiment include the replacement of the insulating film 11 by that shown either at $11_a$ in FIG. 12 or at $11_b$ in FIG. 13, and of the cap layer $34_a$ by an ohmic contact layer of a semiconducting nitride such as n-type GaN.

Figure 19:
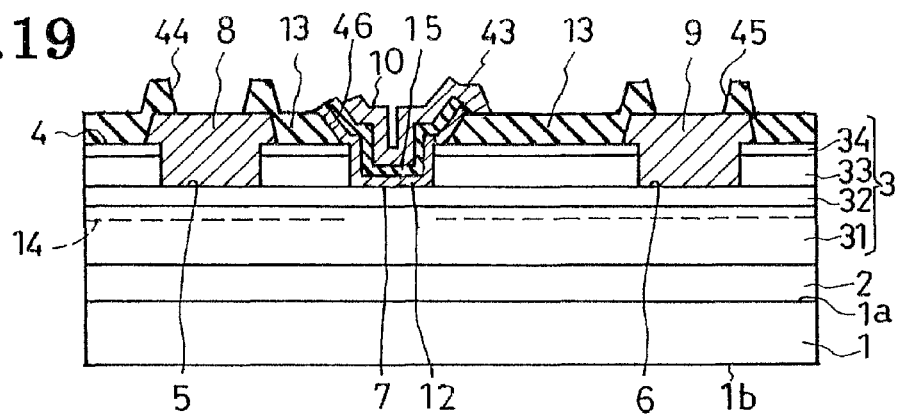
FIG. 19 is a diagrammatic sectional illustration of a further preferred form of normally-off heterojunction field-effect semiconductor device according to the invention.

Embodiment of FIG. 19

The insulating film 11 seen under the p-type metal oxide semiconductor film 12 in FIG. 1 is absent from this FIG. 19 embodiment; instead, a similar insulating film 15 is inserted between gate electrode 10 and p-type metal oxide semiconductor film 12. All the other details of construction are as above described with reference to FIG. 1.

The insulating film 15 is made from the same material (e.g., silicon oxide), and to the same thickness, as the insulating film 11 of FIG. 1. The gate electrode 10 is received in the third recess 7 and held against the first electron supply layer 32 of the main semiconductor region 3 via the p-type metal oxide semiconductor film 12 and insulating film 15. It is therefore apparent that this embodiment also provides for reduction of gate leak current, besides operating normally off like the first disclosed embodiment.

In the embodiments of FIGS. 12-18, too, an insulating film could be placed between gate electrode 10 and p-type metal oxide semiconductor film 12 instead of under this semiconductor film 12. The insulating film 15 in either FIG. 19 or any of FIGS. 12-18 might differ in material or thickness from the insulating film 11 of FIG. 1.

Figure 20:
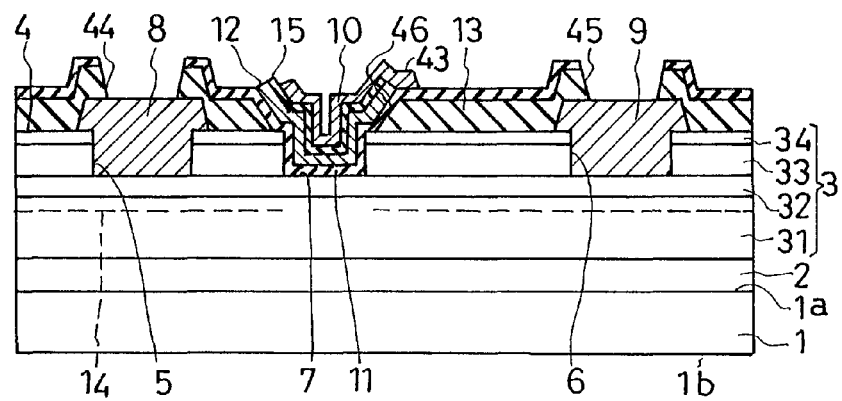
FIG. 20 is a diagrammatic sectional illustration of a further preferred form of normally-off heterojunction field-effect semiconductor device according to the invention.

Embodiment of FIG. 20

A second insulating film 15 is added to the FIG. 1 embodiment to form the device of FIG. 20, so that this latter embodiment has two insulating films 11 and 15 received in the third recess 7 in the main semiconductor region 3. Thus the gate electrode 10 is held against the first electron supply layer 32 of the main semiconductor region 3 via the two insulating films 11 and 15 and p-type metal oxide semiconductor layer 12.

Made from the same material (silicon oxide), and to the same thickness, as the insulating film 11 of FIG. 1, the second insulating film 15 is positioned between gate electrode 10 and p-type metal oxide semiconductor film 12. The first insulating film 11 of this embodiment lies between the p-type metal oxide semiconductor film 12 and the first electron supply layer 32 of the main semiconductor region 3. All the other details of construction are as set forth above with reference to FIG. 1.

It is therefore apparent that this embodiment also operates normally off. The two insulating films 11 and 15 assure more positive curtailment of gate leak current.

The teachings of this embodiment are applicable to the embodiments of FIGS. 12-18 as well. The two insulating films 11 and 15 could differ in material or thickness or both.

Figure 21:
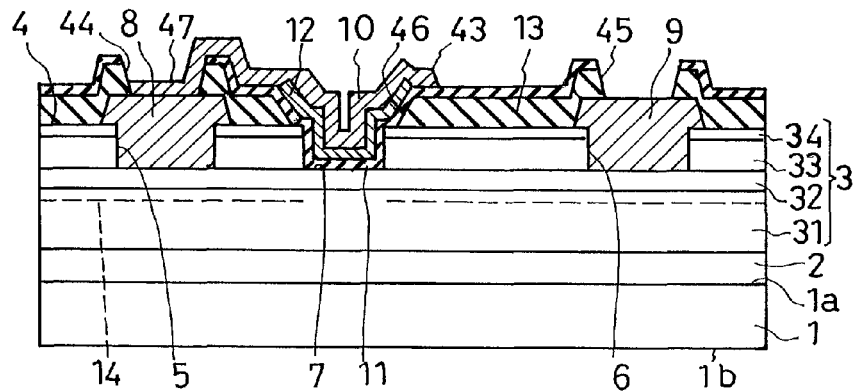
FIG. 21 is a diagrammatic sectional illustration of a further preferred form of normally-off heterojunction field-effect semiconductor device capable of diode-like operation according to the invention.

Embodiment of FIG. 21

The heterojunction field-effect semiconductor device according to the invention is here shown adapted for use as a 2DEG diode. Employed to this end is a conductor 47 formed on the insulating film 11 for electrically interconnecting the source electrode 8 and gate electrode 10. The conductor 47 is shown to be of one-piece construction with the gate electrode 10, although it could be formed independently and from a different material. All the other details of construction of the 2DEG diode are as above stated in conjunction with the FIG. 1 embodiment.

Were it not for the conductor 47, the FIG. 21 device would operate as a normally-off field-effect semiconductor device like that of FIG. 1. However, with the source electrode 8 and gate electrode 10 shorted by the conductor 47 as in this embodiment, a high speed diode is obtained. The gate electrode 10 will be equal in potential to the source electrode 8 and less in potential than the electron transit layer 31 when the drain electrode 9 is higher in potential than the source electrode 8. An electron depletion will then occur at that part of the electron transit layer 31 which underlies the gate electrode 10, causing nonconduction between source electrode 8 and drain electrode 9.

Conversely, when the source electrode 8 is higher in potential than the drain electrode 9, the gate electrode 10 will be higher in potential than the drain electrode 9 and electron transit layer 31 because the gate electrode 10 is at the same potential with the source electrode 8. No depletion zone will then be created under the gate electrode 10 if the voltage between gate electrode 10 and electron transit layer 31 is above the threshold. Conduction will thus be established between source electrode 8 and drain electrode 9.

The above described operation of the FIG. 21 device is that of a diode. Since the current flows through the 2DEG 14 in this embodiment, its operation is faster than the conventional pn-junction diode. The faster-acting 2DEG diode, moreover, gains all the listed advantages of the FIG. 1 embodiment.

This embodiment is itself subject to additional modifications. Instead of directly connecting the source and gate electrodes 8 and 10 by the conductor 47 formed on the insulating film 11, these electrodes may be interconnected by either an external conductor or an external switching circuit. The embodiments of FIGS. 12-20 are likewise adaptable for 2DEG diodes by interconnecting their source and gate electrodes 8 and 10.

Figure 22:
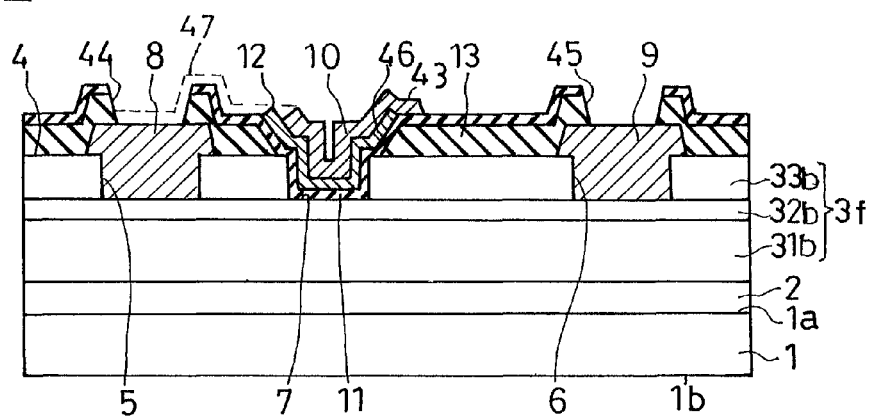
FIG. 22 is a diagrammatic sectional illustration of a normally-off MESFET-type field-effect semiconductor device according to the invention.

Embodiment of FIG. 22

Here is shown an adaptation of the present invention for a MESFET. This embodiment is of the same construction as that of FIG. 1 except for some slight modifications in a main semiconductor region $3_f$. The modified main semiconductor region $3_f$ is a lamination of three semiconductor layers $31_b$, $32_b$ and $33_b$, deposited in that order on the major surface $1_a$ of the substrate 1 via the buffer 2. The first semiconductor layer $31_b$ is made from the same material as the electron transit layer 31 of the FIG. 1 embodiment. The second and third semiconductor layers $32_b$ and $33_b$ are both made from semiconducting nitrides (e.g., AlGaN) doped with an n-type impurity (e.g., Si).

The three recesses 5-7 are all formed in the third semiconductor layer $33_b$ of the main semiconductor region $3_f$, exposing parts of the surface of the underlying second semiconductor layer $32_b$. As in the FIG. 1 embodiment, the gate electrode 10 is received in the third recess 7 via the insulating film 11 and p-type metal oxide semiconductor film 12. The source electrode 8 and drain electrode 9 are received respectively in the second and third recesses 5 and 6, making ohmic contact with the second semiconductor layer $32_b$.

It is the n-type second semiconductor layer $32_b$ of the main semiconductor region $3_f$ that provides the channel between source electrode 8 and drain electrode 9. For the desired normally-off operation of the device, this second semiconductor layer $32_b$ must be sufficiently thin (e.g., 5-10 nanometers) to cause nonconduction between the electrodes 8 and 9 as a result of an electron depletion zone created under the gate electrode 10 when the gate electrode 10 is unexcited. With the second semiconductor layer $32_b$ made so thin, its part under the gate electrode 10 will normally become devoid of electrons by the action of the p-type metal oxide semiconductor film 12 received in the third recess 7. The MESFET is therefore normally off.

The operation of this device is similar to that of the FET. Upon application of an above-threshold voltage between source electrode 8 and gate electrode 10 while the drain electrode 9 is higher in potential than the source electrode 8, a drain current will flow along the path comprised of the drain electrode 9, second semiconductor layer $32_b$ and source electrode 8.

The following is a list of advantages offered by this embodiment of the invention:

1. A normally-off MESFET is obtained which operates reliably by virtue of the p-type metal oxide semiconductor film 12.

2. Thanks to the p-type metal oxide semiconductor film 12, the second semiconductor layer $32_b$ need not be made excessively thin for the normally-off operation of the device. The second semiconductor layer $32_b$ may be made thick enough to lower the on-resistance between the source and drain electrodes 8 and 9 to a desired degree.

3. The insulating film 11 between main semiconductor region $3_a$ and gate electrode 10 realizes a reduction of gate leak current as in the FIG. 1 embodiment.

This normally-off MESFET is also adaptable for use as a diode. To this end, as indicated by the dashed line in FIG. 22, a conductor similar to that indicated at 47 in FIG. 21 may be provided for interconnecting the source and gate electrodes 8 and 10.

Another possible modification of this embodiment is the integration of the second and third semiconductor layers $32_b$ and $33_b$ into a second layer that is just as thick as the two layers $32_b$ and $33_b$ combined. The third recess 7 may be formed in this second layer so as to terminate short of the first layer $31_b$. The current will then flow through the remainder of the second layer under the third recess 7.

A further possible modification of this FIG. 22 embodiment is the replacement of the gate construction in the third recess 7 by either the lamination of the p-type metal oxide semiconductor layer 12, insulating film 46 and gate electrode 10 as in FIG. 19 or the lamination of the first insulating film 11, p-type metal oxide semiconductor film 12, second insulating film 46 and gate electrode 10 as in FIG. 20.

A still further modification is the omission of the first and second recesses 5 and 6 and the placement of the source and drain electrodes 8 and 9 on the surface of the third semiconductor layer $33_b$. This third semiconductor layer $33_b$ is also eliminable. The insulating film 11 is replaceable by either the insulating film $11_a$, FIG. 12, or the insulating film $11_b$, FIG. 13.

Figure 23:
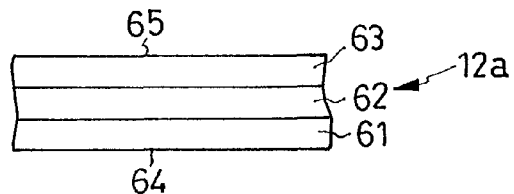
FIG. 23 is a fragmentary, diagrammatic illustration of a modified p-type metal oxide semiconductor film according to the invention.

Embodiment of FIG. 23

Seen in this figure is part of a modified p-type metal oxide semiconductor film $12_a$ which is believed to be best suited for use in the FIG. 19 embodiment in substitution for the p-type metal oxide semiconductor film 12. However, the modified p-type metal oxide semiconductor film $12_a$ may find use in the gate constructions of FIGS. 1 and 20 as well.

Referring more specifically to FIG. 23, the modified p-type metal oxide semiconductor film $12_a$ is of multilayer construction comprising a first layer 61 of nickel oxide, a second layer 62 of iron oxide, and a third layer 63 of cobalt oxide. The multilayer p-type metal oxide semiconductor film $12_a$ has a pair of opposite surfaces 64 and 65. The first 64 of these surfaces is to be held against the first electron supply layer 32, FIG. 19, of the main semiconductor region 3, and the second surface 65 against the gate electrode 10 via the insulating film 46.

When used in the FIG. 1 embodiment, the multilayer p-type metal oxide semiconductor film $12_a$ has its first surface 64 held against the first electron supply layer 32 of the main semiconductor region 3 via the insulating film 11, and its second surface 65 against the gate electrode 10. When used in the FIG. 20 embodiment, the multilayer p-type metal oxide semiconductor film $12_a$ has its first surface 64 held against the first electron supply layer 32 of the main semiconductor region 3 via the first insulating film 11, and its second surface 65 against the gate electrode 10 via the second insulating film 15. For the best results, the multilayer p-type metal oxide semiconductor film $12_a$ should have its first layer 61 the highest, and its third layer 63 the lowest, in hole concentration.

The multilayer p-type metal oxide semiconductor film $12_a$ is designed to make more positive and reliable the normally-off performance of the device realized by the monolayered counterpart 12 of the preceding embodiments. The materials of the individual layers 61-63 of this multilayer p-type metal oxide semiconductor film $12_a$ may be interchanged among nickel oxide, iron oxide, and cobalt oxide, or these layers may be made from other metal oxides such as those of manganese and copper. It is also possible to omit one (e.g., third layer 63) of the three layers 61-63 or to add some other layer or layers. The multilayer p-type metal oxide semiconductor film $12_a$ is substitutable for its monolayered counterpart 12 not only in FIGS. 1, 19 and 20 but in FIGS. 12-18 as well.

Figure 24:
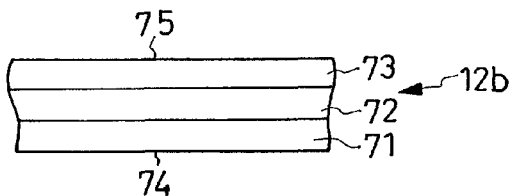
FIG. 24 is a fragmentary, diagrammatic illustration of another modified p-type metal oxide semiconductor film according to the invention.

Embodiment of FIG. 24

Here is shown another modified p-type metal oxide semiconductor film $12_b$ which is believed to be best suited for use in the FIG. 19 embodiment in substitution for its counterpart 12. However, this modified film $12_b$ is also substitutable for its counterpart 12 in the gate constructions of FIGS. 1 and 20.

The second modified p-type metal oxide semiconductor film $12_b$ is similar to the first modified p-type metal oxide semiconductor film $12_a$ in having three layers 71, 72 and 73 which, however, are all made from nickel oxide but differ in hole concentration. The hole concentrations of the nickel oxide layers 71-73 drop from the lowermost one upward or in the order of 71, 72 and 73. The fabrication of such nickel oxide layers with different hole concentrations is possible by, for example, the magnetron sputtering of nickel oxide, with concurrent addition and/or ion implantation of oxygen. The rate of oxygen introduction may be lowered stepwise with the progress of the sputtering.

The multilayer p-type metal oxide semiconductor film $12_b$ has a pair of opposite surfaces 74 and 75. The first 74 of these surfaces is to be held against the first electron supply layer 32, FIG. 19, of the main semiconductor region 3, and the second surface 75 against the gate electrode 10 via the insulating film 46. When used in the FIG. 1 embodiment, the multilayer p-type metal oxide semiconductor film $12_b$ has its first surface 74 held against the first electron supply layer 32 of the main semiconductor region 3 via the insulating film 11, and its second surface 75 against the gate electrode 10. When used in the FIG. 20 embodiment, the multilayer p-type metal oxide semiconductor film $12_b$ has its first surface 74 held against the first electron supply layer 32 of the main semiconductor region 3 via the first insulating film 11, and its second surface 75 against the gate electrode 10 via the second insulating film 15.

This multilayer p-type metal oxide semiconductor film $12_b$ also serves for the desired normally-off performance of the device, and that more reliably as its first layer 71, the highest in hole concentration, comes into direct contact with the first electron supply layer 32. The constituent layers 71-73 of this multilayer p-type metal oxide semiconductor film $12_b$ may be made from an oxide of metals other than nickel, such as iron, cobalt, manganese and copper. It is also possible to omit one (e.g., third layer 73) of these layers 71-73 or to add one or more layers. The multilayer p-type metal oxide semiconductor film $12_b$ is substitutable for its monolayered counterpart 12 not only in FIGS. 1, 19 and 20 but in FIGS. 12-18 as well.

The hole concentration of the p-type metal oxide semiconductor film $12_b$ may be varied in its thickness direction by methods other than those suggested above. For example, in the course of film formation, the conditions of heat treatment, ozone ashing or molecular oxygen ashing may be varied as required. Another possible method is to control the dosage of lithium doping during the progress of film formation.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative normally-off heterojunction field-effect semiconductor devices and methods of their fabrication which are all believed to fall within the purview of the claims annexed hereto:

1. The main semiconductor regions 3 and $3_a$-$3_f$ of the illustrated embodiments could be made from compound semiconductors other than GaN and AlGaN, such as other Groups III-V compound semiconductors including InGaN, AlInGaN, AlN, InAlN, AlP, GaP, AlInP, GaInP, AlGaP, AlGaAs, GaAs, AlAs, InAs, InP, InN, and GaAsP, and Groups II-VI compound semiconductors including ZnO.

2. The known source field plate and drain field plate could be incorporated.

3. A desired number of field-effect semiconductor devices, each constructed like any of the illustrated embodiments, may be built into one chip in parallel connection with one another.

4. The electron supply layers 32 and 33 of the main semiconductor regions in the illustrated embodiments are replaceable by hole supply layers, in which case a two-dimensional hole gas (2DHG) will appear in lieu of the 2DEG 14. Also, in this case, the p-type metal oxide semiconductor film of the various embodiments may be replaced by an n-type metal oxide semiconductor film. In the FIG. 22 embodiment, too, the n-type semiconductor layers $32_b$ and $33_b$ of the main semiconductor region $3_f$ may be replaced by p-type ones, and an n-type metal oxide semiconductor layer may be formed thereon.

5. Lithium, rather than oxygen, may be added for obtaining the p-type metal oxide semiconductor film 12, $12_a$ or $12_b$.

6. The second electron supply layer 33 and cap layer 34 are removable from the embodiments of FIGS. 1, 12-14 and 17-21.

7. The second and third electron supply layers 33 and 36 and cap layer 34 are removable from the FIG. 15 embodiment.

8. The electron supply layer 33 is removable from the FIG. 16 embodiment.

9. The recesses 5 and 6 for the source and drain electrodes 8 and 9 in the embodiments of FIGS. 1, 12-17 and 19-22 need not be of the illustrated depths; instead, for example, they may terminate short of the first electron supply layer 32 or $32_b$.

What is claimed is:

1. A field-effect semiconductor device comprising:
   (a) a main semiconductor region having a first and a second semiconductor layer of dis-similar semiconducting materials such that a two-dimensional carrier gas is generated in the first semiconductor layer along a heterojunction between the first and the second semiconductor layer, the main semiconductor region having a major surface;
   (b) a first and a second main electrode disposed in spaced-apart positions on the major surface of the main semiconductor region and electrically coupled to the two-dimensional carrier gas in the first semiconductor layer of the main semiconductor region;
   (c) a gate electrode disposed between, and spaced from, the first and the second main electrode on the major surface of the main semiconductor region for controlling conduction between the first and the second main electrode via the two-dimensional carrier gas layer;
   (d) a metal oxide semiconductor film disposed between the main semiconductor region and the gate electrode and having a conductivity type such that a depletion zone is normally created in the two-dimensional carrier gas layer through reduction of charge carriers; and
   (e) an insulating film disposed between the main semiconductor region and the gate electrode.

2. A field-effect semiconductor device as defined in claim 1, wherein the insulating film is disposed between the main semiconductor region and the metal oxide semiconductor film.

3. A field-effect semiconductor device as defined in claim 1, wherein the insulating film is disposed between the gate electrode and the metal oxide semiconductor film.

4. A field-effect semiconductor device as defined in claim 3, further comprising a second insulating film disposed between the main semiconductor region and the metal oxide semiconductor film.

5. A field-effect semiconductor device as defined in claim 1, wherein the main semiconductor region has formed therein a recess extending from the major surface of the main semiconductor region and terminating short of the first semiconductor layer thereof, and wherein the gate electrode is received in the recess.

6. A field-effect semiconductor device as defined in claim 5, wherein the second semiconductor layer of the main semiconductor region has part between the recess and the first semiconductor layer of the main semiconductor region, said part of the second semiconductor layer being so thick that the two-dimensional carrier gas is formed without the depletion zone in the absence of the metal oxide semiconductor film, and that the two-dimensional carrier gas has the depletion zone formed therein in the presence of the metal oxide semiconductor film.

7. A field-effect semiconductor device as defined in claim 1, wherein the main semiconductor region has a first and a second recess formed in the major surface thereof, and wherein the first and the second main electrode are received respectively in the first and the second recess.

8. A field-effect semiconductor device as defined in claim 1, wherein the main semiconductor region has a two-dimensional electron gas generated therein as the two-dimensional carrier gas, and wherein the metal oxide semiconductor film is of p-type.

9. A field-effect semiconductor device as defined in claim 8, wherein the p-type metal oxide semiconductor film is made from at least one metal oxide selected from the group consisting of nickel oxide, iron oxide, cobalt oxide, manganese oxide, and copper oxide.

10. A field-effect semiconductor device as defined in claim 8, wherein the p-type metal oxide semiconductor film is formed by ion implantation of oxygen into a metal oxide.

11. A field-effect semiconductor device as defined in claim 8, wherein the p-type metal oxide semiconductor film is formed by sputtering in an oxygen-containing atmosphere.

12. A field-effect semiconductor device as defined in claim 8, wherein the p-type metal oxide semiconductor film is of nickel oxide, and wherein the gate electrode is a lamination of a nickel layer and a gold layer, with the nickel layer being contiguous to the p-type metal oxide semiconductor layer.

13. A field-effect semiconductor device as defined in claim 8, wherein the p-type metal oxide semiconductor film is a lamination of a plurality of layers of dissimilar p-type metal oxide semiconductors.

14. A field-effect semiconductor device as defined in claim 8, wherein the p-type meal oxide semiconductor film varies in hole density in a direction normal to the major surface of the main semiconductor region.

15. A field-effect semiconductor device as defined in claim 2, wherein the main semiconductor region further comprises a third semiconductor layer on the second semiconductor layer, the third semiconductor layer being higher in carrier density than the second semiconductor layer, and wherein the recess is formed in at least part of the third semiconductor layer of the main semiconductor region.

16. A field-effect semiconductor device as defined in claim 15, wherein the first semiconductor layer of the main semiconductor region is of a nitride semiconductor, wherein the second semiconductor layer of the main semiconductor region is of a nitride semiconductor containing aluminum, and wherein the third semiconductor layer of the main semiconductor region is of a nitride semiconductor containing a greater proportion of aluminum than the second semiconductor layer.

17. A field-effect semiconductor device as defined in claim 16, wherein the main semiconductor region further comprises a fourth semiconductor layer on the third semiconductor layer, the fourth semiconductor layer being of a nitride semiconductor having an aluminum proportion less than that of the third semiconductor layer, and wherein the recess is formed at least in the third and the fourth semiconductor layer.

18. A field-effect semiconductor device as defined in claim 16, wherein the main semiconductor region further comprises a fourth semiconductor region on the third semiconductor layer, the fourth semiconductor layer being less in carrier concentration than the third semiconductor layer, and a fifth semiconductor layer on the fourth semiconductor layer, the fifth semiconductor layer being of a nitride semiconductor having an aluminum proportion less than that of the third semiconductor layer, and wherein the recess is formed at least in the third and the fourth and the fifth semiconductor layer.

19. A field-effect semiconductor device as defined in claim 1, wherein the main semiconductor region further comprises a spacer between the first and the second semiconductor layer, the spacer being thinner than the second semiconductor layer and containing aluminum in a higher proportion than the second semiconductor layer.

20. A field-effect semiconductor device as defined in claim 1, further comprising a protective film of electrically insulating material covering at least parts of the major surface of the main semiconductor region between the first main electrode and the gate electrode and between the second main electrode and the gate electrode.

21. A field-effect semiconductor device as defined in claim 1, further comprising an electric conductor connecting the gate electrode to the first main electrode whereby the device is adapted for diode-like operation.

\* \* \* \* \*